United States Patent

Krantz et al.

[11] 4,275,945
[45] Jun. 30, 1981

[54] FILTER CONNECTOR WITH COMPOUND FILTER ELEMENTS

[75] Inventors: Leonard A. Krantz; Edward P. Hogan, both of Sidney, N.Y.

[73] Assignee: The Bendix Corporation, Southfield, Mich.

[21] Appl. No.: 71,445

[22] Filed: Aug. 31, 1979

[51] Int. Cl.[3] .......................................... H01R 13/66
[52] U.S. Cl. ................................. 339/147 R; 333/182
[58] Field of Search ................. 339/143, 147; 333/182

[56] References Cited

U.S. PATENT DOCUMENTS

| 2,940,058 | 6/1960 | Foster | 333/182 |
|---|---|---|---|
| 3,035,237 | 5/1962 | Schlicke | 333/182 |
| 3,320,557 | 5/1967 | Garstang | 333/182 |
| 3,456,215 | 7/1969 | Denes | 333/182 |
| 3,569,915 | 3/1971 | Sorensen et al. | 339/147R |
| 3,710,285 | 1/1973 | Schor et al. | 333/182 |
| 3,789,263 | 1/1974 | Fritz et al. | 333/182 |
| 3,825,874 | 7/1974 | Peverill | 339/143 R |
| 4,029,386 | 6/1977 | Krantz, Jr. et al. | 339/143 R |

Primary Examiner—John McQuade

Attorney, Agent, or Firm—Paul J. Ethington; Raymond J. Eifler; Charles D. Lacina

[57] ABSTRACT

A filter connector is disclosed having a compound filter with two filter elements (20,22) connected in cascade in the filter contact (14). Separate ground plates (40,50) are provided for each of the filter elements (20,22). Each filter element, such as a pi section filter, is provided with an electrode arrangement which facilitates connection of filter elements in cascade and minimizes susceptibility to flash-over between electrodes. The filter element comprises a center conductor (74) with a dielectric sleeve (100) coaxially thereof. A ground electrode (80) is disposed on the external surface of the sleeve, one active electrode (78) extends from the internal surface to the external surface of the sleeve over one end surface thereof and another active electrode (82) extends from the internal surface to the external surface of the sleeve over the other end surface thereof. The marginal space between the active electrode (78) and the ground electrode (80) is on the external surface of the sleeve and is coated with a dielectric material (108). Similarly, the marginal space between the active electrode (82) and the ground electrode (80) is coated by a dielectric material (116).

5 Claims, 5 Drawing Figures

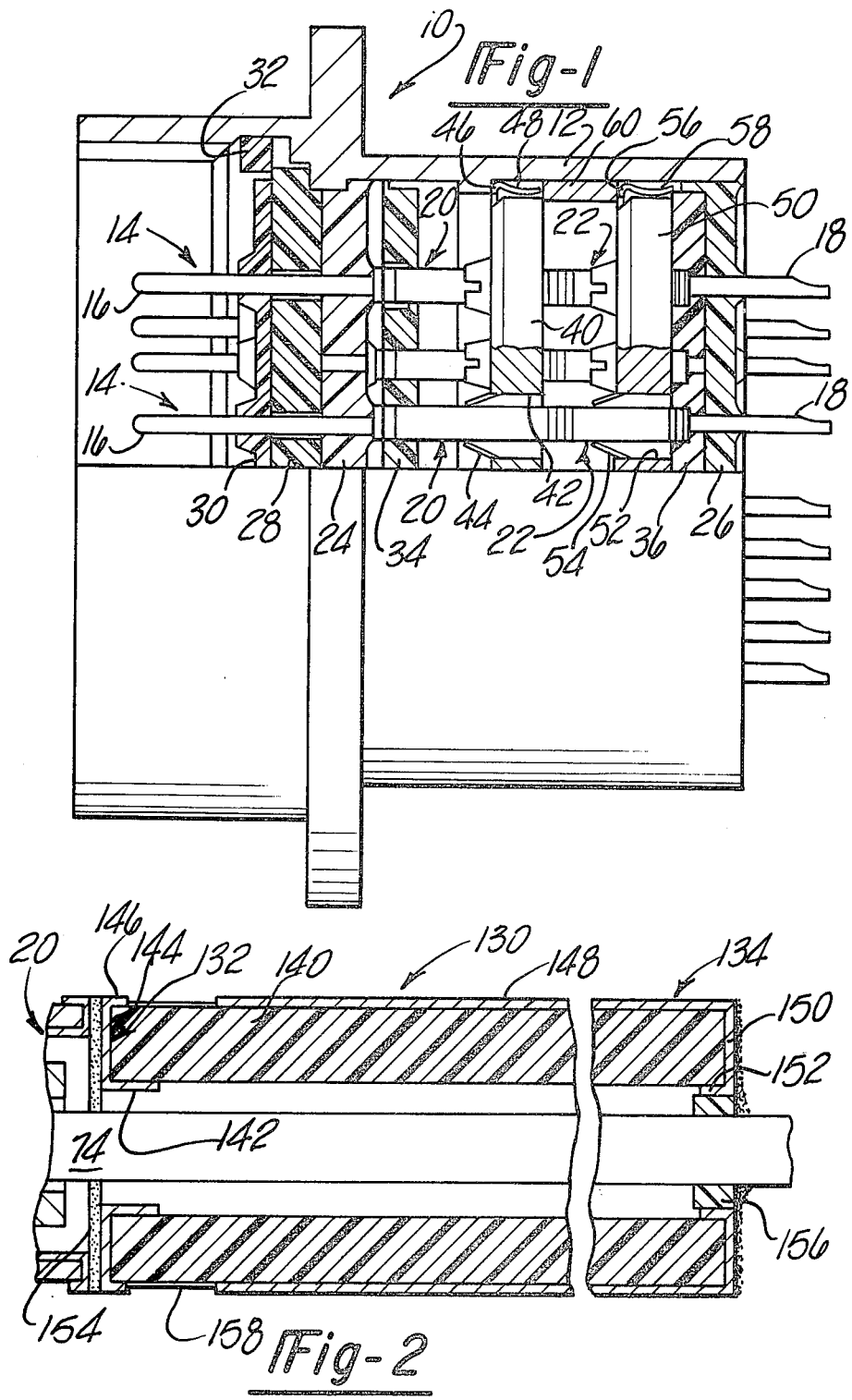

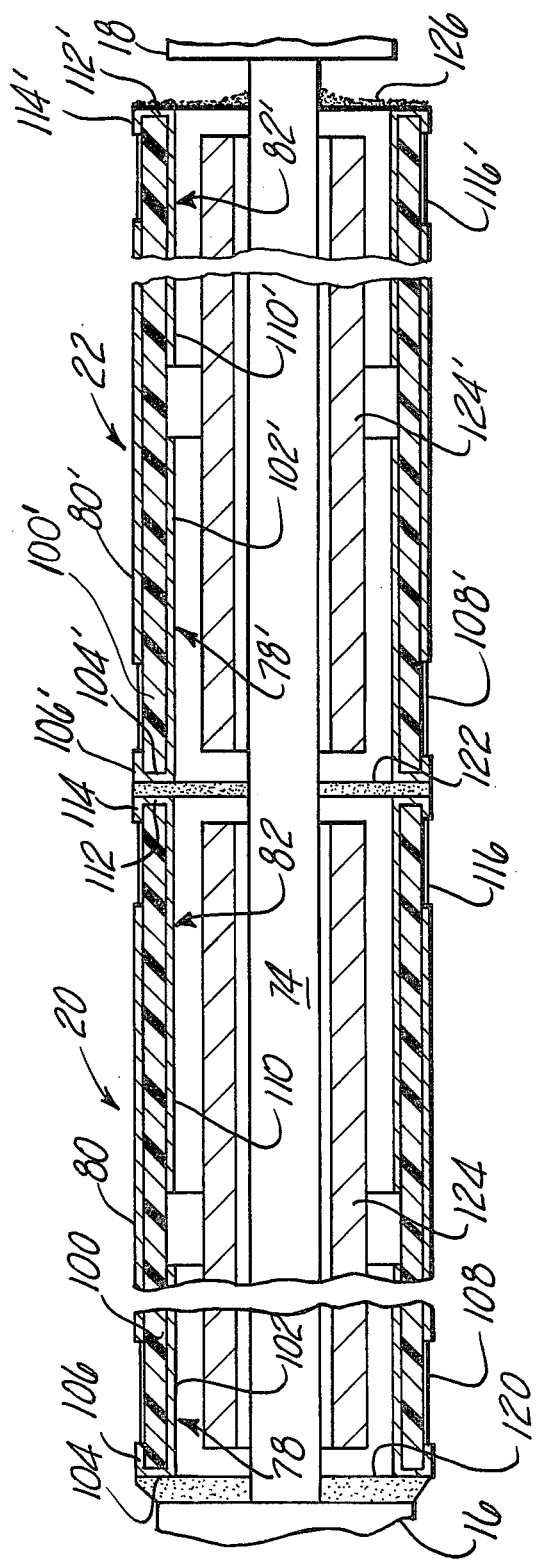
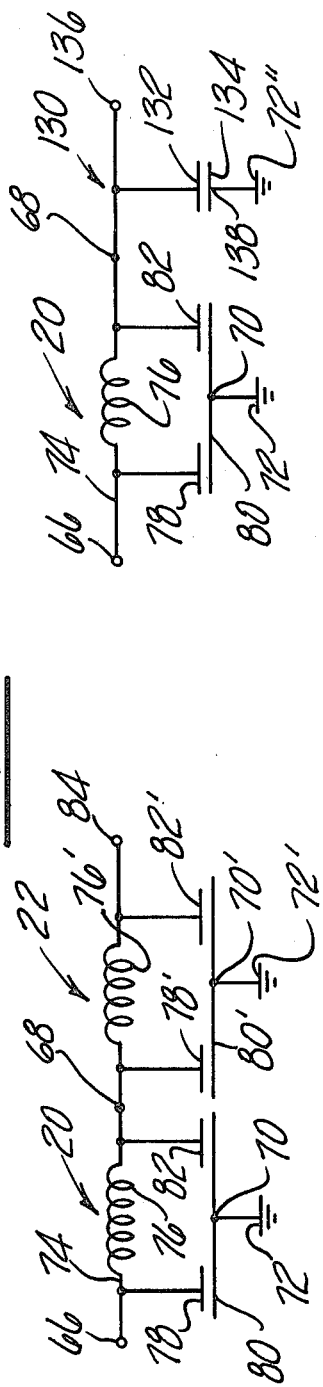
Fig-3
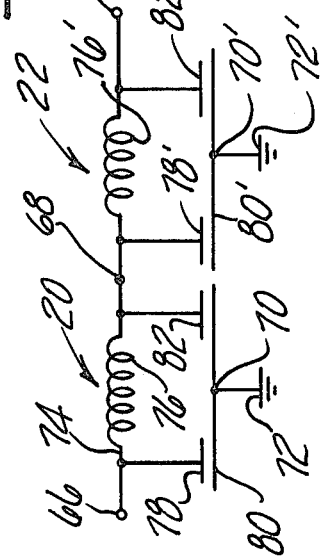
Fig-5
Fig-4

4,275,945

FILTER CONNECTOR WITH COMPOUND FILTER ELEMENTS

TECHNICAL FIELD

This invention relates to electrical connectors of the type having a contact in one connector member and a complementary contact in the other connector member for interconnecting electrical circuits. More particularly, this invention relates to filter connectors in which an electrical filter is incorporated into the structure of one connector member and coupled with the contact thereof.

BACKGROUND OF THE INVENTION

In the prior art, filter connectors typically have a filter element disposed upon a portion of the connector contact. Such a filter element may comprise a pi section filter which includes inductive and capacitive components for the purpose of attenuating unwanted signals, such as radio frequency interference.

A filter connector of the aforementioned type is disclosed in U.S. Pat. No. 4,029,386 granted to Krantz et al. In the filter connector of the Krantz patent, each of the contacts is provided with a filter element in the form of a cylindrical sleeve disposed over the center conductor of the contact in a region between the mating end of the contact and the wire receiving end of the contact. The filter network may include one or more capacitors having a common ground electrode disposed on the exterior surface of the sleeve. The ground electrode is connected to the shell of the connector member which constitutes circuit ground, through a circular ground plate within the shell. The ground plate is provided with an opening for each contact of the connector and each opening has plural spring fingers in frictional engagement with the ground electrode on the respective filter element. The ground plate is connected with the metal shell of the connector through a conductive ring having multiple spring fingers thereon. Such a ground plate with spring contacts is advantageous in that it provides a solderless ground connection.

In certain applications, it is desirable to utilize filter connectors wherein one or more contacts are provided with a compound filter i.e. a filter made up of two or more filter elements. For example, such a compound filter may comprise a pair of pi filter sections in cascade wherein each pi section is a physically discrete element. Also such a compound filter may comprise an unbalanced pi filter wherein a pi section and a shunt capacitor section are connected in cascade, each comprising a physically discrete filter element.

In filter connectors with compound filters, one of the problems in the prior art is that of providing a suitable ground connection for the filter element. In one arrangement, with the filter elements connected end-to-end, a common ground connection may be provided for connecting the ground electrodes of the filter capacitor to the connector shell. One difficulty found in this arrangement is that the adjacent active electrodes of the capacitors in the two filter elements are subject to flash-over resulting in failure of the filter.

Prior patents which relate to ground connections, especially ground plates having spring contacts, include U.S. Pat. No. 3,710,285 to Schor, et al., U.S. Pat. No. 3,569,915 to Sorenson, et al., U.S. Pat. No. 3,721,869 to Paoli, and U.S. Pat. No. 3,825,874 to Peverill.

A general object of this invention is to provide an improved capacitor electrode and grounding arrangement for filter connectors having compound filters.

DISCLOSURE OF THE INVENTION

In accordance with this invention, a filter connector is provided with an electrical contact having two or more filter elements connected therewith with separate ground connections to the connector shell. This is accomplished by plural filter elements connected in cascade, each having a tubular capacitor with an external ground electrode which is separately connected to a ground member for each filter element. Preferably, each filter element includes a center conductor, a dielectric sleeve disposed coaxially thereof with at least one active capacitor electrode and a ground electrode thereon. The ground electrode is disposed on the external surface of the sleeve. The plural filter elements are connected in cascade with the active electrodes conductively connected with the center conductor and a separate conductive ground plate for each filter element. Each ground plate is disposed within the shell of the connector and has spring contacts engaging the ground electrode to the respective filter and has spring contacts engaging the shell.

Further, in accordance with this invention, a filter element for filter connectors is provided which is especially adapted for cascade connection with similar filter elements. This is accomplished by an electrode arrangement which facilitates interconnection of adjacent filter elements and minimizes the susceptibility to flash-over between electrodes. A preferred embodiment comprises a filter element having a center conductor with a dielectric sleeve disposed coaxially thereof with the ground electrode on the external surface of the sleeve and with at least one active electrode extending from the internal surface to the external surface of the sleeve over one end surface thereof. In this arrangement, two or more filter elements are connected in cascade by conductive connections between each active electrode and the center conductor and a conductive connection between each ground electrode and a ground member of the connector. Preferably, a solderless connection may be provided between each ground electrode and the metal shell of the connector by a ground plate having spring contacts engaging the ground electrode and the metal shell. Further, in this arrangement, the marginal space between the active electrodes and the ground electrodes on the external surface of the dielectric sleeve may be readily coated with a dielectric material to inhibit flash-over.

A more complete understanding of this invention may be obtained from the detailed description that follows taken with the accompanying drawings.

DESCRIPTION OF THE DRAWINGS

FIG. 1 is a view in elevation, with parts broken away, of a filter connector according to this invention, FIG. 2 is a fragmentary view, partially in section, of a pair of filter elements connected in cascade, FIG. 3 is a view, partially in section, of another pair of filter elements connected in cascade, FIG. 4 is a schematic diagram of the circuit of the filter elements of FIG. 3, and FIG. 5 is a schematic diagram of the filter elements of FIG. 2.

BEST MODE FOR CARRYING OUT THE INVENTION

Referring now to the drawings, there is shown an illustrative embodiment of the invention in a filter connector of the plug and receptacle type having multiple contacts supported within a cylindrical shell. It will be appreciated, as the description proceeds, that the invention is useful in many different electrical connector applications.

FIG. 1 shows an electrical connector member 10 which incorporates the subject invention. The connector member 10 comprises, in general, a cylindrical metal shell 12 and multiple electrical contacts 14. The connector member 10 is a connector receptacle which is adapted to mate with a connector plug (not shown) in a well known manner to provide electrical interconnection between multiple electrical circuits. Each of the contacts 14 is a pin type contact and is adapted to mate with a corresponding socket type contact (not shown) on the connector plug.

Each of the pin contacts 14 comprises a mating end 16 and a wire receiving end 18. Each contact 14 also comprises a filter element 20 and a filter element 22 disposed intermediate the mating end 16 and the wire receiving end 18 of the contact. The filter elements will be described in greater detail subsequently.

The contacts 14 are mounted within the shell 12 as follows. The mating ends 16 of the contacts are supported in a disc 24, suitably epoxy resin, and the wire receiving ends of the contacts are supported in a disc 26, also suitably epoxy resin. The mating ends of the contacts extend through dielectric insert 28 of plastic and through an interfacial seal 30, of soft elastomeric material. A gasket 32 is disposed around the seal 30. A seal 34 of elastomeric material is disposed behind the resin disc 24 to retain the resin before it is cured. Similarly a seal 36 is disposed forwardly of the resin disc 26 to retain it while it is cured. It is noted that the resin discs 24 and 26 provide support for each contact 14 at the forward and rearward ends, respectively, of the filter elements 20 and 22 thus encapsulate and isolate the filter elements from forces applied to the ends of the contacts.

In order to provide a grounding circuit for each of the filter elements 20, a ground plate 40 is provided. The ground plate 40 is suitably a molded plastic wafer plated with gold or silver over nickel for electrical conductivity. The plate 40 has an aperture 42 corresponding to each contact 14 and has spring contacts or tines 44 surrounding each aperture and integral with the plate 40. The tines 44 are adapted to frictionally engage the outer surface of the filter element 20. The ground plate 40 is provided with a ground ring 46 of spring metal which is seated against an internal flange on the shell 12. The ground ring 46 is provided with spring contacts or fingers 48 which frictionally engage the periphery of the plate 40 and provide a conductive connection therewith to the shell 12. Similarly, the filter elements 22 are provided with a grounding circuit including a ground plate 50 of the same construction as ground plate 40 and including apertures 52 and spring tines 54 which frictionally engage the outer surface of the filter elements 22. A ground ring 56 having spring contacts or fingers 58 surrounds the ground ring 50. A spacer ring 60 of metal is disposed between the ground rings 56 and 46. The metal shell 12 of the connector member constitutes an electrical ground and, as will be discussed subsequently, the filter elements 20 are connected to electrical ground through the ground plate 40 and ground ring 46 while the filter elements 22 are connected to the shell 12 through the ground plate 50 and the ground ring 56.

FIG. 3 shows the filter elements 20 and 22 of one of the contacts 14. The schematic diagram of the electrical network of the filter elements 20 and 22 is shown in FIG. 4. Referring first to FIG. 4, the filter element 20 is a pi filter section having an input terminal 66, an output terminal 68 and a ground terminal 70. The ground terminal is connected to electrical ground 72 which as stated above is constituted by the metal shell 12. The filter element 20 includes a conductor 74 which exhibits series inductance 76. It also includes a capacitor having an active electrode 78 connected with the input terminal 66 and a ground electrode 80 connected with the ground terminal 70. Similarly, the filter element 20 includes a capacitor having an active electrode 82 connected with the output terminal 68 and the ground electrode 80 connected with the ground terminal 70. The filter element 22 is of the same circuit configuration and the conductor 74 extends from the terminal 68 to an output terminal 84 and exhibits series inductance 76'. Filter element 22 includes a capacitor having an active electrode 78' connected with terminal 68 and a ground electrode 80' connected with ground terminal 70' which is connected with electrical ground 72'. Similarly, filter element 72 includes a capacitor having an active electrode 82' connected with the output terminal 84 and the ground electrode 80' connected with the ground terminal 70'.

Referring now to FIG. 3, the filter elements 20 and 22 are shown in structural configuration. The mating end 16 of the contact 14 is connected with the wire receiving end 18 through the filter elements 20 and 22. More particularly, the center conductor 74 is conductively connected with the mating end 16 and the wire receiving end 18. The filter element 20 comprises a tubular capacitor which includes a dielectric sleeve 100 and the electrodes 78, 80 and 82. The dielectric sleeve 100, suitably of ceramic, is disposed coaxially of the center conductor 74. The ground electrode 80 is a continuous metal layer on the external surface sleeve 100 and comprises a band which extends around the circumference of the sleeve. The active electrode 78 is also a continuous metal layer having an annular band 102 on the internal surface of the sleeve 100 extending around the circumference of the sleeve. The active electrode 78 also includes an annular band 104 disposed on the end surface of the sleeve 100 and extending around the circumference thereof and it includes an annular band 106 on the external surface of the sleeve and extending around the circumference. The active electrode 78 and the ground electrode 80 are separated by a marginal space or region of the sleeve 100 which is covered by a dielectric coating 108 to inhibit flash-over between the electrodes. The active electrode 82 comprises annular band 110 on the internal surface of the sleeve 100, an annular band 112 on the end surface of the sleeve and an annular band 114 on the external surface of the sleeve. The ground electrode 80 and the active electrode 82 are separated by a marginal space or region of the sleeve surface which is covered by a coating 116, the same as coating 108. The active capacitor electrode 78 is connected with the center conductor 74 by a solder clad metal washer 120. Similarly, the active electrode 82 is connected with the center conductor 74 by a solder clad metal washer 122. A ferrite sleeve 124 is disposed inside the sleeve 100 and causes the conductor 74 to exhibit the series inductance 76 (see FIG. 4).

The filter element 22 is of the same structure as described above with reference to filter element 20. Accordingly, it will suffice to note that corresponding parts are identified by the same reference characters having a prime symbol added thereto. Additionally, it is noted that the active electrode 78' is connected with the center conductor 74 by the solder clad washer 122. Similarly, the active electrode 82 is conductively connected with the center conductor 74 by a solder clad metal washer 126.

The filter contact 14, with the filter elements 20 and 22, is installed as previously described with reference to FIG. 1. It is noted that the ground electrode 80 of filter element 20 is connected through the ground plate 40 and ground ring 46 to the metal shell 12. The filter element 22 is provided with a separate grounding circuit with the ground electrode 80' connected through the ground plate 50 and ground ring 56 to the metal shell 12.

It is further noted, with reference to FIG. 3, that the electrode arrangement in the filter elements 20 and 22 greatly diminishes the problem of flash-over between electrodes in the cascade connection. The marginal space between the ground electrode 80 and the active electrode 78 is on the external surface of the sleeve 100 and is coated with a dielectric layer 108. Similarly, the marginal space between the ground electrode 80 and the active electrode 82 is external and is coated with the dielectric layer 116. The only other marginal space between electrodes i.e. that between active electrode 78 and active electrode 110, is internal; however, the voltage difference between these electrodes will be small compared to the voltage to ground and presents no problem of flash-over.

According to the invention, the compound filter may be made up of a plurality of different filter elements connected in cascade. FIGS. 2 and 5 show a filter contact with an unbalanced pi filter network which is comprised of a filter element 20 and a filter element 130. Referring first to the schematic diagram of FIG. 5, the filter element 20 is as described with reference to FIG. 4. The filter element 130 comprises a shunt capacitor having an active electrode 132 and a ground electrode 134. The center conductor 74 extends through the filter element 130 to an output terminal 136. The active electrode 132 is connected with the center conductor 74 and the ground electrode 134 has a ground terminal 138 connected to ground 72''.

As shown in FIG. 2, the filter element 130 comprises a dielectric sleeve 140 disposed coaxially of the center conductor 74. The active electrode 132 comprises a metal layer including an annular band 142 on the internal surface of the sleeve, an annular band 144 on the end surface of the sleeve, and an annular band 146 on the external surface of the sleeve. The ground electrode 134 comprises a metal layer including an annular band 148 on the external surface of the sleeve 140, an annular band 150 on the end surface of the sleeve, and an annular band 152 on the internal surface of the sleeve. The active electrode 132 is conductively connected to the center conductor 74 by a solder clad metal washer 154. The ground electrode 134 is insulated from the center conductor 74 and the sleeve 140 is supported thereon by a ring 156 of dielectric material.

If desired, the marginal space between the active electrode 132 and ground electrode 134 on the external surface of the sleeve 140 may be coated with a dielectric layer 158. The filter element 130 may also be provided with additional electrode area by means of multiple layers (not shown) disposed within the body of the dielectric sleeve 140; as such, it may take the form of a multilayer monolithic, tubular ceramic capacitor. The filter element 130, together with the filter element 20 in cascade are connected to ground in the same manner as described with reference to filter elements 20 and 22.

Although the description of this invention has been given with reference to a particular embodiment, it is not to be construed in a limiting sense. Many variations and modifications will now occur to those skilled in the art. For a definition of the invention reference is made to the appended claims.

What is claimed is:

1. In combination with a filter connector of the type having a metal shell and a plurality of filter contacts mounted in said shell, each of said filter contacts having a center conductor and a first and second filter element mounted on each of said center conductors; each of said filter elements including a dielectric sleeve disposed coaxially of said conductor and having at least one active capacitor electrode and a common ground electrode thereon, said ground electrode being disposed on the external surface of said sleeve; said first and second filter elements being connected in cascade with the active electrodes conductively connected with said central conductor; the improvement comprising:
   a ferri-ceramic sleeve interposed coaxially of the dielectric sleeve and the conductor;
   a first ground plate connecting the ground electrode of each of said first filter elements to said shell;
   a second ground plate connecting the ground electrode of each of said second filter elements to said shell;
   said active electrode is separated from the ground electrode; and
   a coating of dielectric material covering the separation between the active electrode and the ground electrode whereby flash over between the ground and the active electrodes is minimized.

2. The filter connector recited in claim 1 wherein each of said ground plates includes on the periphery thereof spring fingers for maintaining pressure tight contact between said shell and said ground plates whereby good electrical contact between said ground plates and said shell is maintained.

3. The filter connector as recited in claim 1 wherein for each filter element said active electrode is disposed on the internal surface of said sleeve and extends to the external surface of the sleeve over one end surface thereof, said active electrode terminating a predetermined distance from said ground electrode.

4. The filter connector as recited in claim 2 wherein for each said filter element said active electrode is disposed on the internal surface of said sleeve and extends to the external surface of the sleeve over one end surface thereof, said active electrode terminating a predetermined distance from said ground electrode.

5. The filter connector as recited in claims 1, 2, 3 or 4 wherein the electrical connector further includes an epoxy material filling each end of said shell; and
   means for preventing said epoxy material from contacting said ground plates, said means located within said shell and between said epoxy material and said ground plates.

* * * * *